United States Patent
Haba et al.

(10) Patent No.: US 7,759,782 B2
(45) Date of Patent: Jul. 20, 2010

(54) SUBSTRATE FOR A MICROELECTRONIC PACKAGE AND METHOD OF FABRICATING THEREOF

(75) Inventors: Belgacem Haba, Saratoga, CA (US);
Craig S. Mitchell, San Jose, CA (US);
Apolinar Alvarez, Jr., Fremont, CA (US)

(73) Assignee: Tessera, Inc., San Jose, CA (US)

( * ) Notice: Subject to any disclaimer, the term of this patent is extended or adjusted under 35 U.S.C. 154(b) by 621 days.

(21) Appl. No.: 11/400,665

(22) Filed: Apr. 7, 2006

(65) Prior Publication Data

US 2007/0235856 A1 Oct. 11, 2007

(51) Int. Cl.
*H01L 23/02* (2006.01)
*H01L 23/34* (2006.01)
*H01L 23/29* (2006.01)
*H01L 23/48* (2006.01)
*H01L 23/52* (2006.01)
*H01L 29/40* (2006.01)

(52) U.S. Cl. ............... 257/686; 257/678; 257/690; 257/723; 257/777; 257/780

(58) Field of Classification Search ......... 257/731–738, 257/758, 774, 777–786, E23.085, 723, 686, 257/678, 690, E23.08
See application file for complete search history.

(56) References Cited

U.S. PATENT DOCUMENTS

| | | | |
|---|---|---|---|
| 5,607,818 A | 3/1997 | Akram et al. | |
| 5,895,967 A | 4/1999 | Stearns et al. | |
| 6,252,178 B1 * | 6/2001 | Hashemi | 174/260 |
| 6,350,668 B1 | 2/2002 | Chakravorty | |
| 6,373,273 B2 | 4/2002 | Akram et al. | |
| 6,426,642 B1 | 7/2002 | Akram et al. | |
| 6,469,393 B2 * | 10/2002 | Oya | 257/779 |
| 6,528,874 B1 | 3/2003 | Iijima et al. | |
| 6,617,236 B2 | 9/2003 | Oosawa et al. | |
| 6,646,337 B2 | 11/2003 | Iijima et al. | |
| 6,753,600 B1 | 6/2004 | Ho | |
| 6,782,610 B1 | 8/2004 | Iijima et al. | |
| 6,828,221 B2 | 12/2004 | Iijima et al. | |
| 6,884,709 B2 | 4/2005 | Iijima et al. | |
| 6,891,273 B2 | 5/2005 | Pu et al. | |
| 7,183,650 B2 * | 2/2007 | Shiono et al. | 257/758 |
| 2003/0183947 A1 * | 10/2003 | Ohuchi | 257/778 |
| 2004/0183167 A1 | 9/2004 | Hortaleza et al. | |
| 2005/0116326 A1 | 6/2005 | Haba et al. | |
| 2005/0181544 A1 | 8/2005 | Haba et al. | |

FOREIGN PATENT DOCUMENTS

CN 20040183167 9/2004

OTHER PUBLICATIONS

International Search Report, PCT/US2008/008134.

* cited by examiner

*Primary Examiner*—Cuong Q Nguyen
(74) *Attorney, Agent, or Firm*—Lerner, David, Littenberg, Krumholz & Mentlik, LLP

(57) ABSTRACT

Substrates having molded dielectric layers and methods of fabricating such substrates are disclosed. The substrates may advantageously be used in microelectronic assemblies having high routing density.

35 Claims, 19 Drawing Sheets

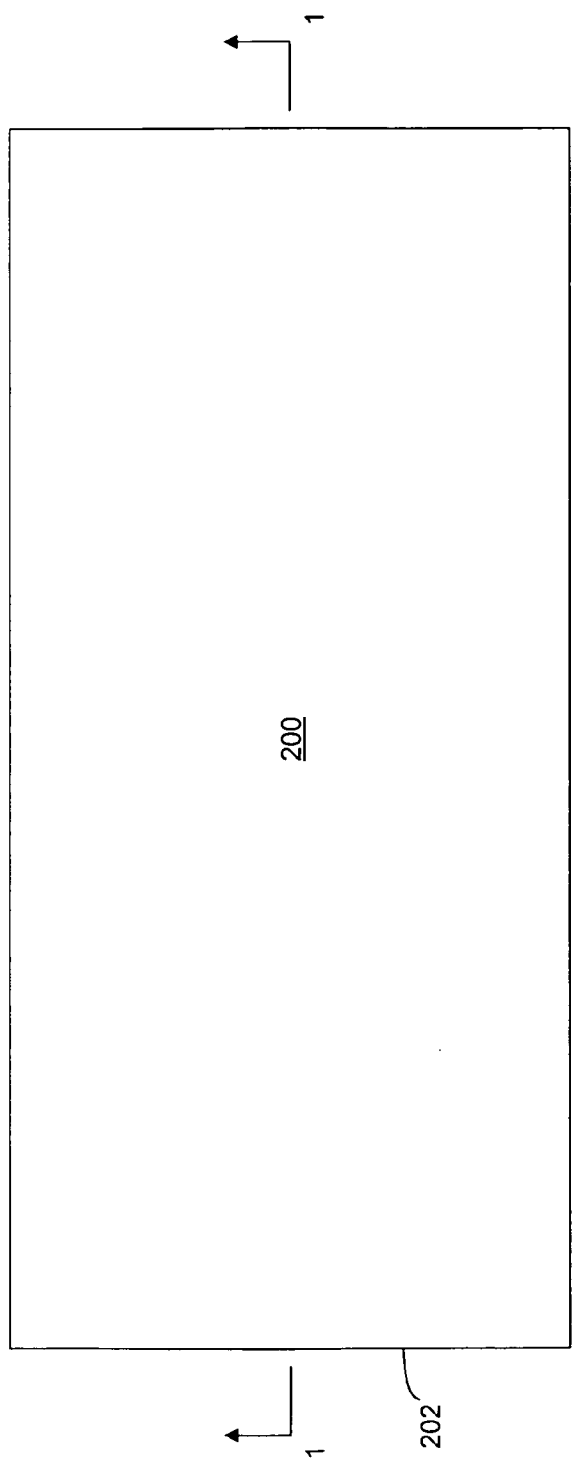
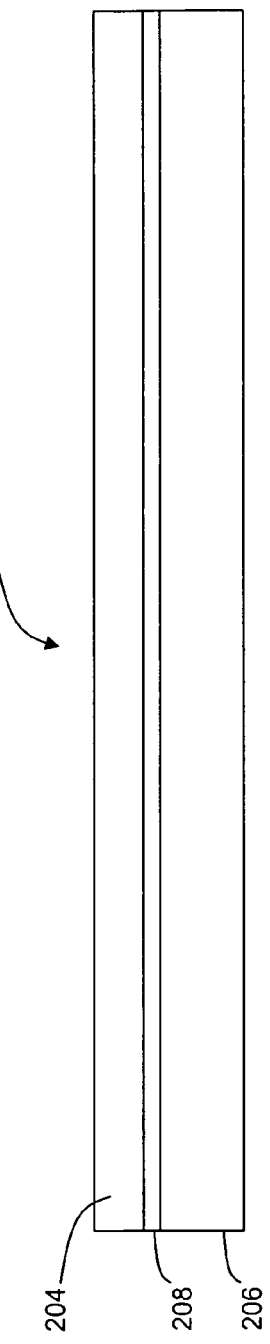

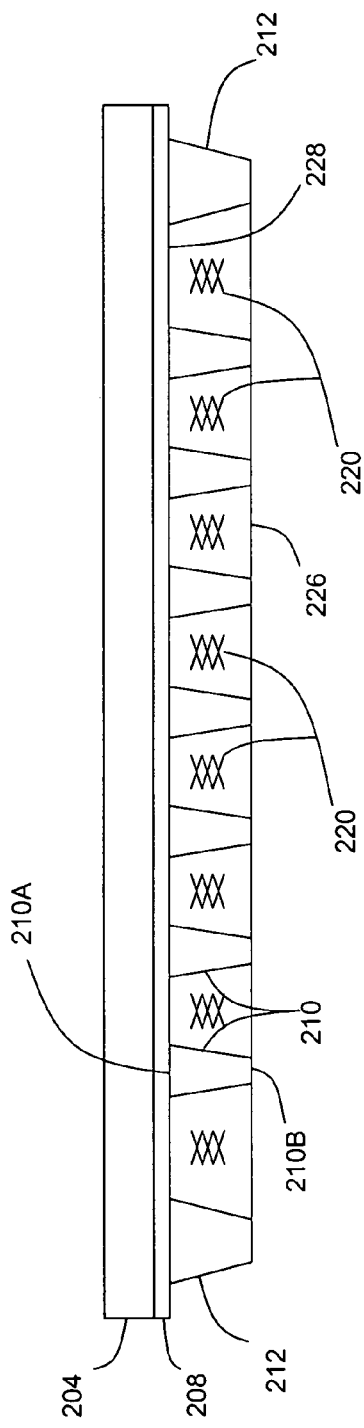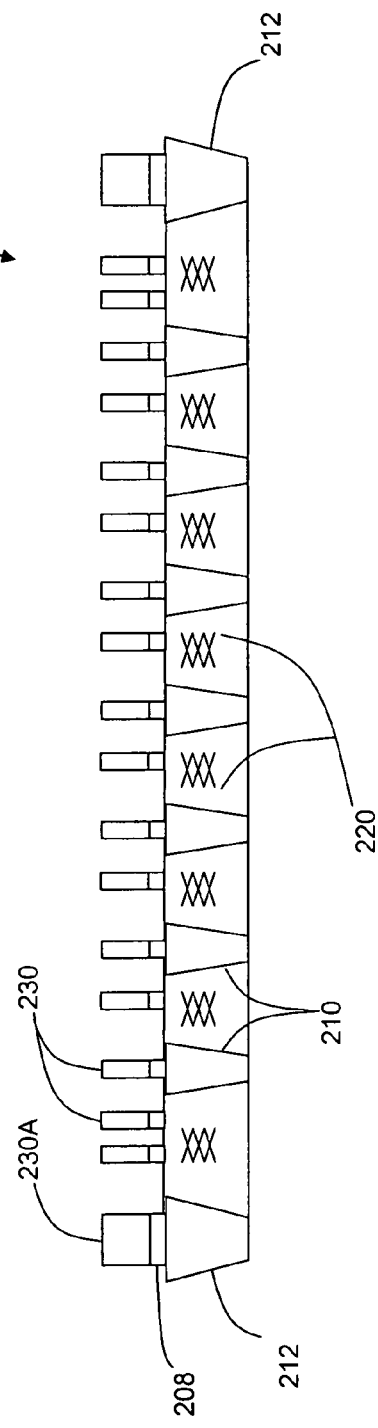

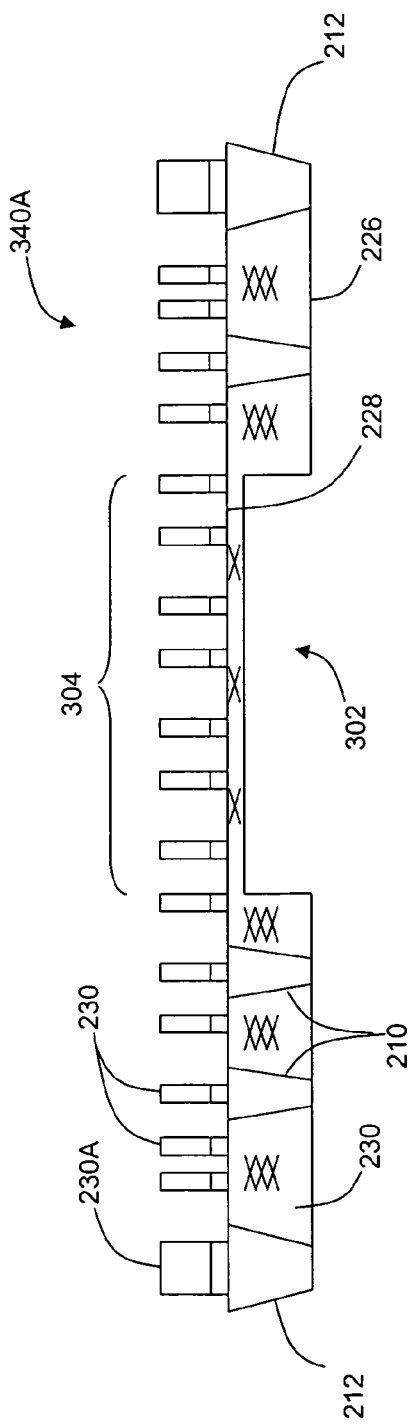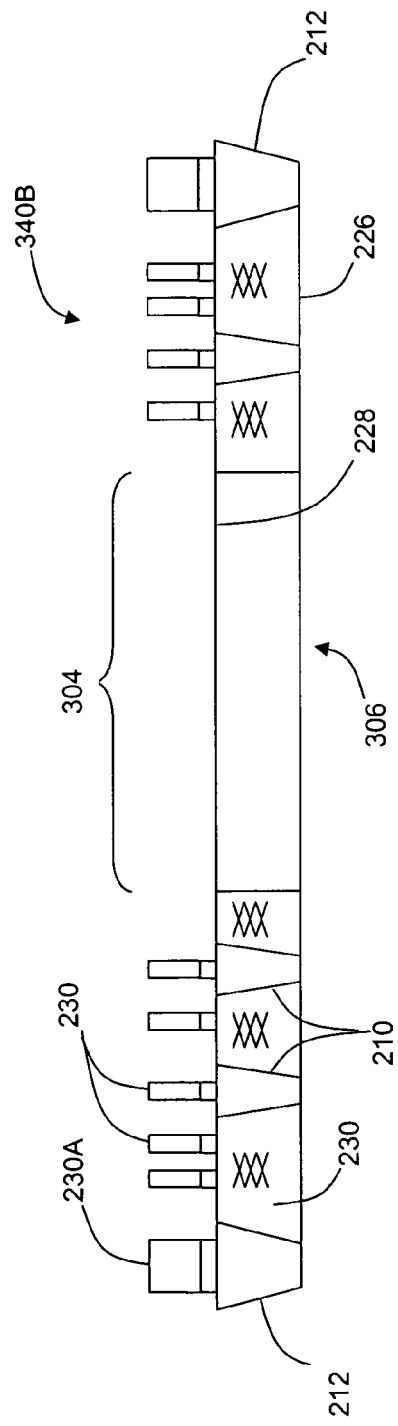

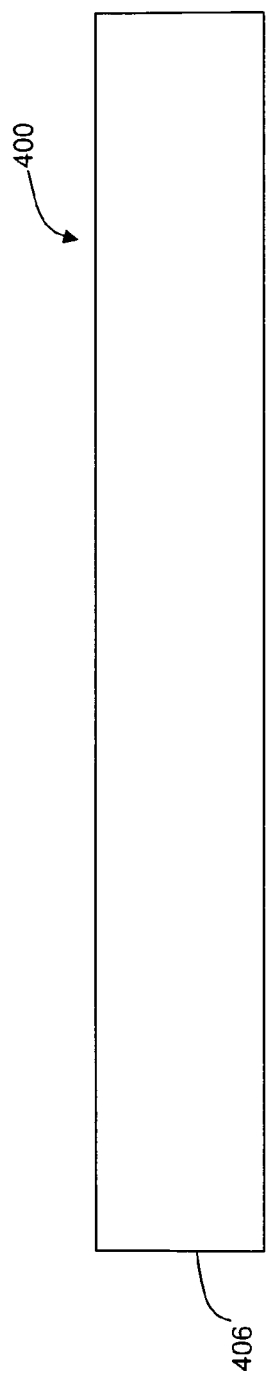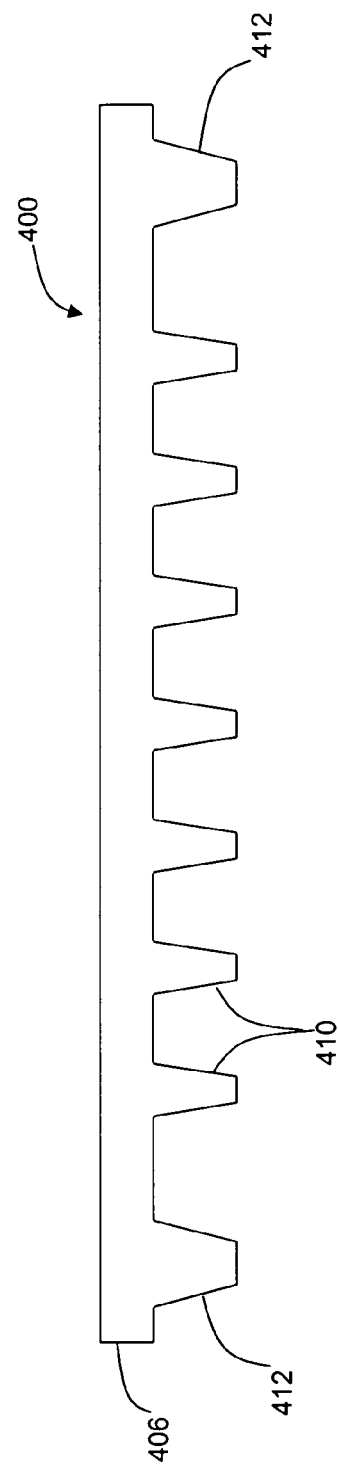
FIG. 4A
FIG. 4B

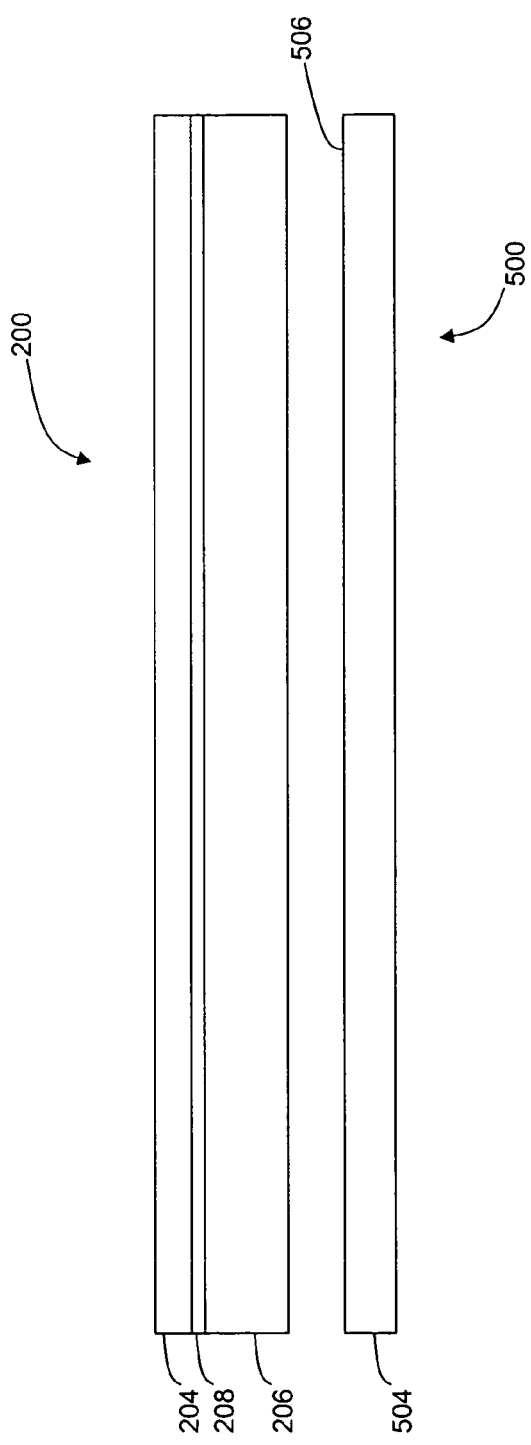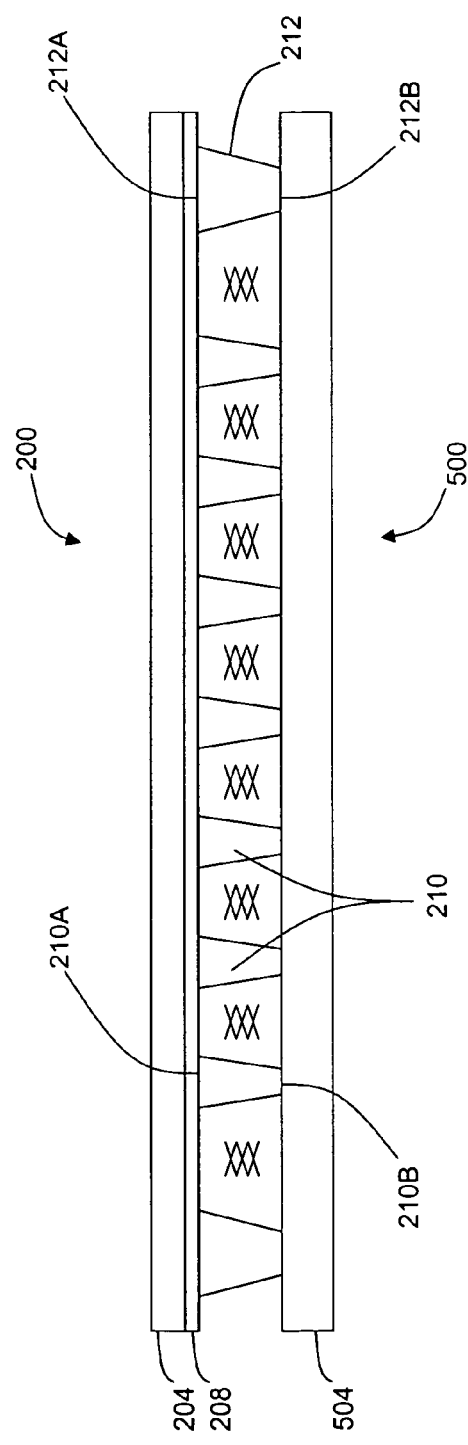

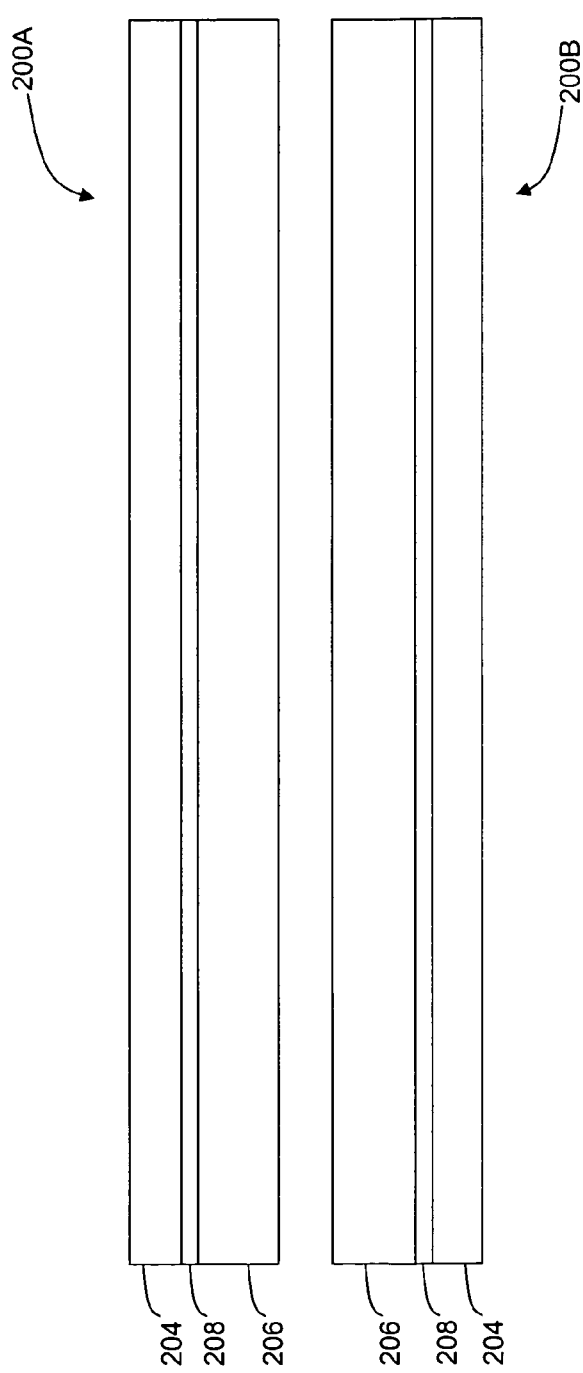

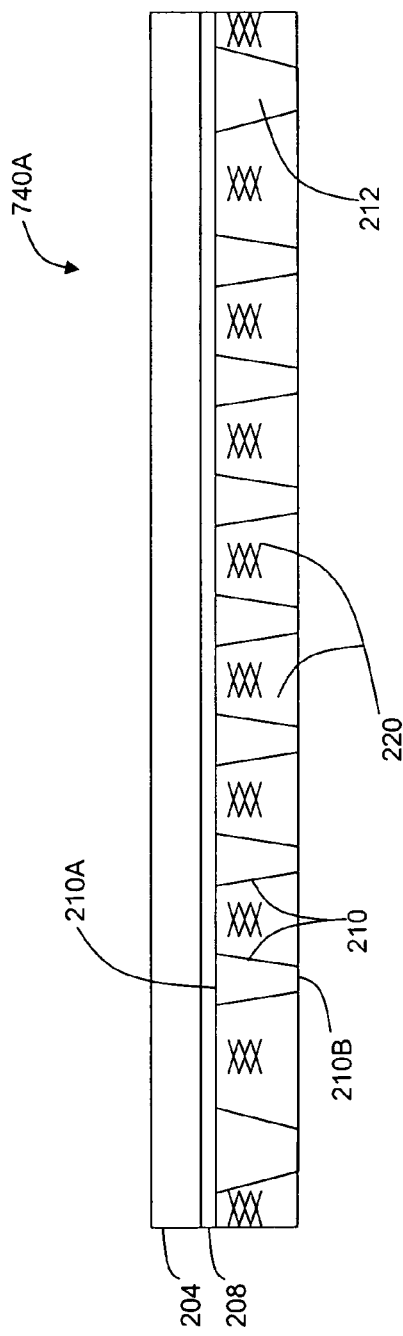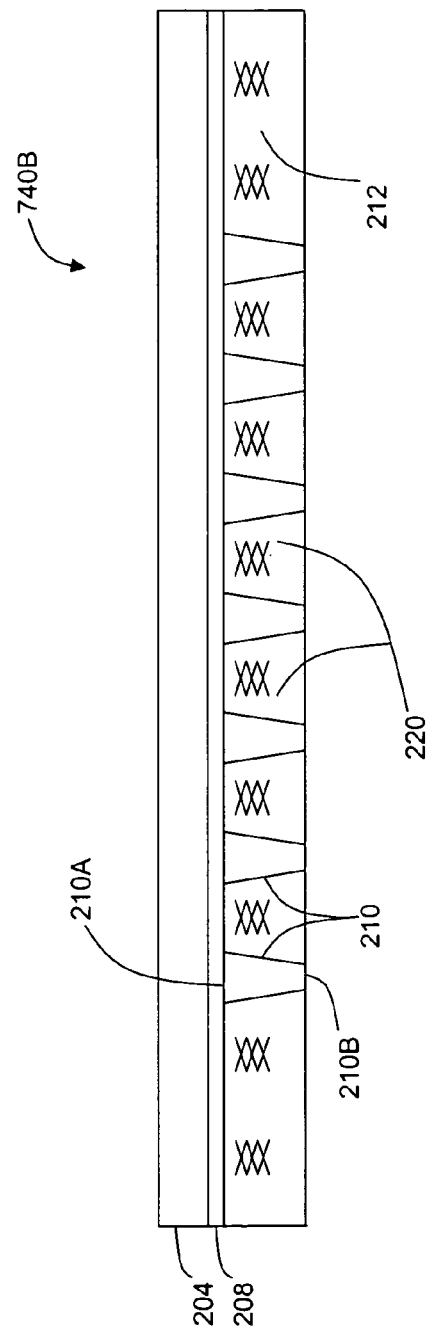

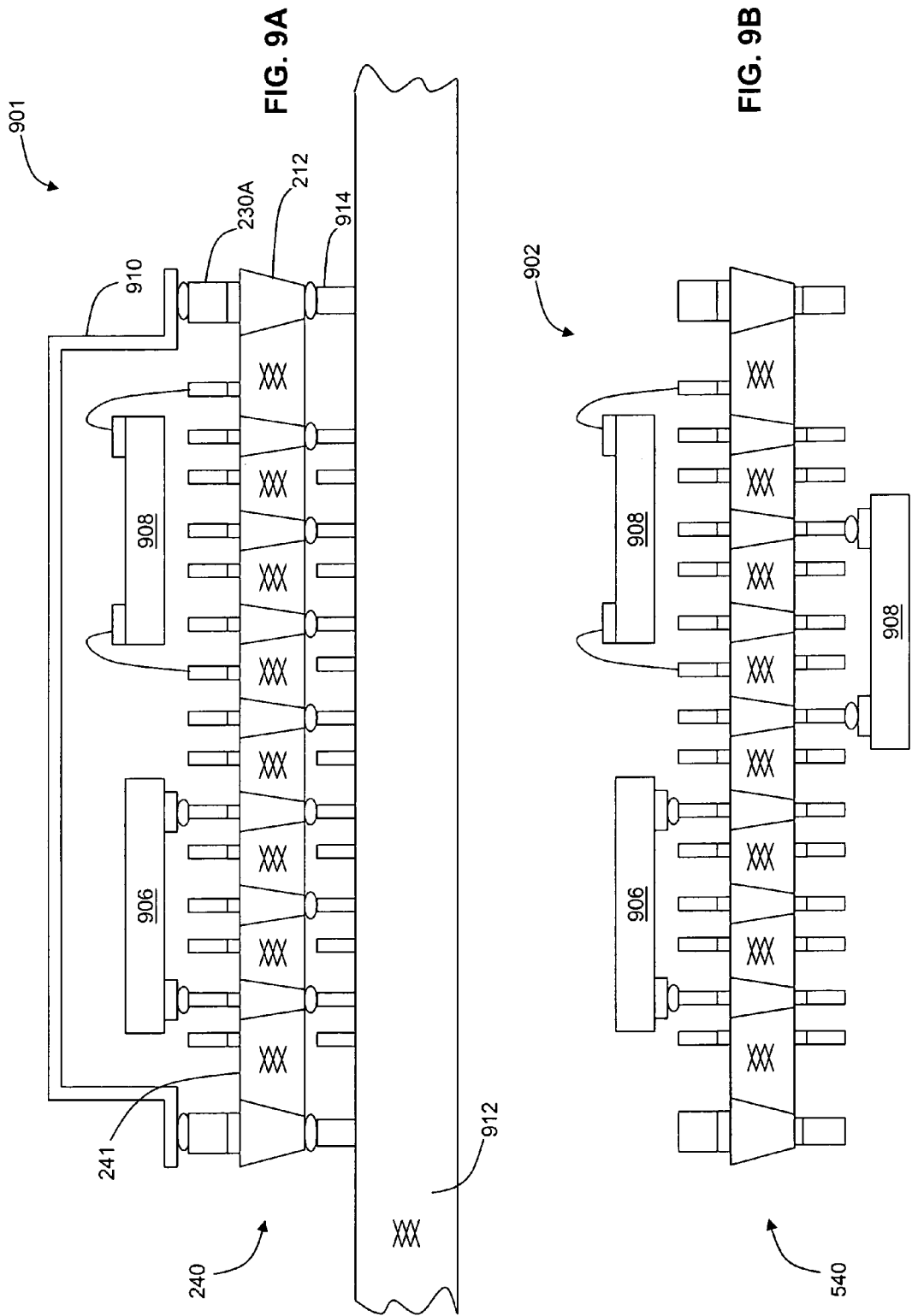

SUBSTRATE FOR A MICROELECTRONIC PACKAGE AND METHOD OF FABRICATING THEREOF

FIELD OF THE INVENTION

The present invention generally relates to microelectronic assemblies and, in particular, to substrates used in microelectronic assemblies and methods of fabricating such substrates.

BACKGROUND OF THE INVENTION

Circuit panels or substrates are widely used in electronic assemblies. Typical circuit panels commonly include a dielectric element in the form of a sheet or plate of dielectric material having numerous conductive traces extending on the sheet or plate. The traces may be provided in one layer or in multiple layers, separated by layers of dielectric material. The circuit panel or substrate may also include conductive elements such as via liners extending through the layers of dielectric material to interconnect traces in different layers. Some circuit panels are used as elements of microelectronic packages. Microelectronic packages generally comprise one or more substrates with one or more microelectronic devices such as one or more semiconductor chips mounted on such substrates. The conductive elements of the substrate may include the conductive traces and terminals for making electrical connection with a larger substrate or circuit panel, thus facilitating electrical connections needed to achieve desired functionality of the devices. The chip is electrically connected to the traces and hence to the terminals, so that the package can be mounted to a larger circuit panel by bonding the terminals to contact pads on the larger circuit panel. For example, some substrates used in microelectronic packaging have terminals in the form of pins extending from the dielectric element.

Despite considerable efforts devoted in the art heretofore to development of substrates and methods for fabricating such substrates, further improvement would be desirable.

SUMMARY OF THE INVENTION

One aspect of the present invention provides a method for fabricating a substrate for a microelectronic package. The method desirably comprises forming a molded dielectric layer which surfaces are coplanar with bases and tips of conductive pins of the substrate. Conductive traces may be formed on one or both sides of the dielectric layer.

Other aspects of the present invention provide substrates such as those fabricated using the disclosed method. Still further aspects of the invention provide microelectronic packages and assemblies which include one or more such substrates.

The Summary is neither intended nor should it be construed as being representative of the full extent and scope of the present invention, which additional aspects will become more readily apparent from the detailed description, particularly when taken together with the appended drawings.

BRIEF DESCRIPTION OF THE DRAWINGS

FIGS. 2A-2I are schematic, plan (FIGS. 2A and 2I), bottom (FIGS. 2D and 2F), and cross-sectional views (FIGS. 2B-2C, 2E, and 2G-2H) of portions of a substrate during successive stages of the method of FIG. 1;

FIGS. 3A-3B are schematic, cross-sectional views of portions of a substrate fabricated during successive stages of a method according to a further embodiment of the invention;

FIGS. 4A-4D are schematic, cross-sectional views of portions of a substrate fabricated during successive stages of a method according to another embodiment of the invention;

FIGS. 5A-5C are schematic, cross-sectional views of portions of a substrate fabricated during successive stages of a method according to yet another embodiment of the invention;

FIGS. 6A-6D are schematic, cross-sectional views of portions of a substrate fabricated during successive stages of a method according to still another embodiment of the invention;

FIG. 7A-7B are schematic, cross-sectional views of portions a substrate fabricated during successive stages of a method according to one more embodiment of the invention;

FIGS. 9A-9D are schematic, cross-sectional views of exemplary microelectronic structures using the substrates fabricated in accordance with the method of FIG. 1.

Herein, identical reference numerals are used, where possible, to designate identical elements that are common to the figures. The images in the drawings are simplified for illustrative purposes and are not depicted to scale.

The appended drawings illustrate exemplary embodiments of the invention and, as such, should not be considered as limiting the scope of the invention that may admit to other equally effective embodiments.

DETAILED DESCRIPTION

Figure 1:
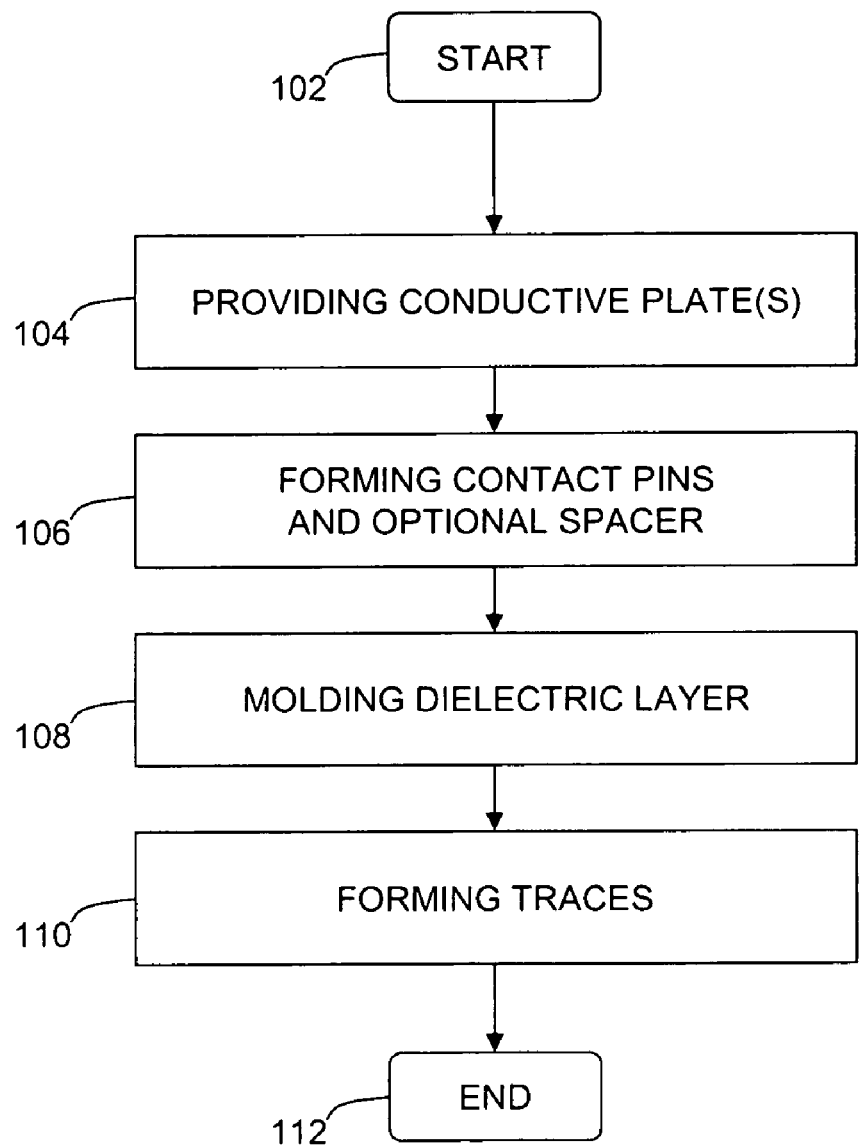
FIG. 1 is a flow diagram illustrating a method in accordance with one embodiment of the present invention.

FIG. 1 depicts a flow diagram illustrating a method 100 for fabricating a substrate having a molded dielectric layer in accordance with one embodiment of the present invention. The method 100 includes processing steps performed during fabrication of the substrate. In some embodiments, these processing steps are performed in the depicted order. In alternate embodiments, at least two of these steps may be performed contemporaneously or in a different order. Sub-steps and auxiliary procedures (e.g., substrate transfers between processing reactors, substrate cleaning sub-steps, process control sub-steps, and the like) are well known in the art and, as such, herein are omitted. Cross-sectional views in the drawings are arbitrarily taken along a centerline 1-1 (shown in FIG. 2A only) of a conductive plate of a substrate being fabricated using the method 100.

The method 100 starts at step 102 and proceeds to step 104. A method according to one embodiment of the invention uses a conductive plate 200 having a perimeter 202 (FIG. 2A). In this particular embodiment, the plate 200 comprises layers 204 and 206 of electrically conductive principal metal (e.g., copper (Cu)) and a conductive barrier layer 208, such as a nickel (Ni) layer (FIG. 2B). A thickness of the plate 200 is generally selected in range from about 10 to 600 μm (e.g., 50 or 100 μm), whereas the layers 204, 206, and 208 typically have thicknesses of about 5 to 300 μm, 5 to 300 μm, and 0.1 to 3 μm, respectively. In one exemplary embodiment, the thicknesses of the layers 204, 206, and 208 are 15, 50, and 1 μm, respectively.

Figure 2C:
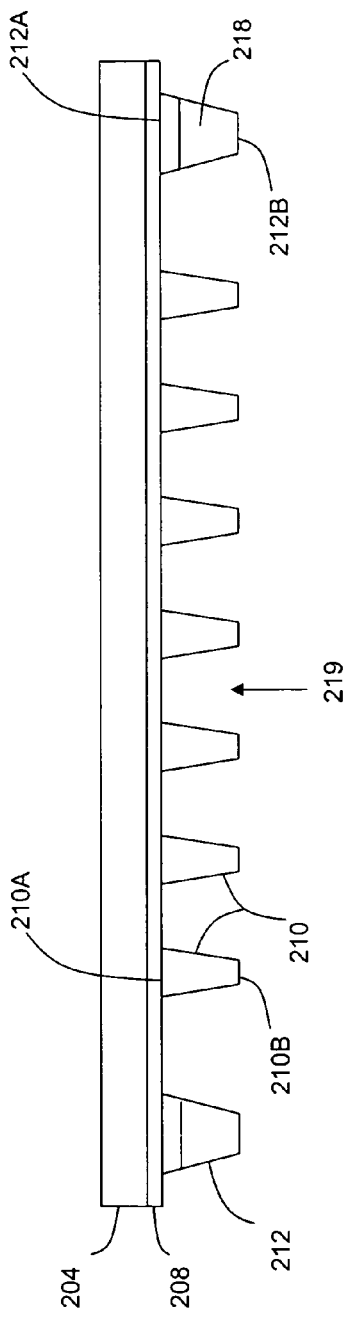

At step 106, a plurality of conductive pins 210 and at least one optional spacer 212 are formed on the plate 200 (FIG. 2C). Each pin 210 comprises a base 210A and a tip 210B, and the spacer 212 comprises a base 212A and a tip 212B. Widths of the bases 210A, 212A and tips 210B, 212B are generally selected in a range from about 50 to 1000 μm, for example, 200-300 μm.

Figure 2D:
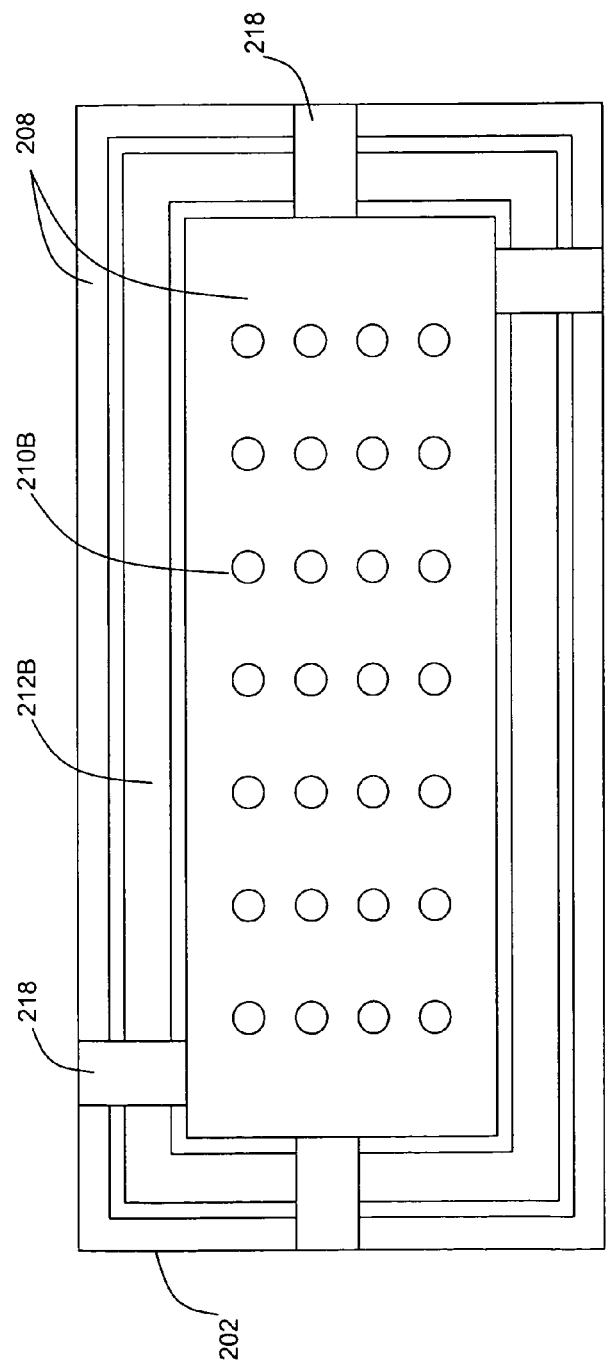

The spacer 212 generally has a closed-loop wall-like form factor and is disposed around an individual section of plate 200 or near the perimeter 202 (as shown), thus surrounding at least some of the pins 210, as illustratively depicted in a bottom plan view (FIG. 2D) taken in the direction of arrow 219 in FIG. 2C. In the particular embodiment, the spacer 212 comprises slots 218 (four slots 218 are arbitrarily shown) which may be used during a molding process of step 108, as discussed below in reference to FIG. 2E. In one embodiment, the pins 210 and spacer 212 are fabricated from the layer 206 by performing an etch process that uses the barrier layer 208 as an etch stop layer to determine a duration of the etch process.

The pins 210 are formed at locations facilitating connectivity between elements of an electrical circuit of the substrate being fabricated. Such pins may have different form factors and be organized, for example, in one or more grid-like patterns having a pitch in a range from 100 to 10000 μm (e.g., 400-650 μm).

Figure 2E:
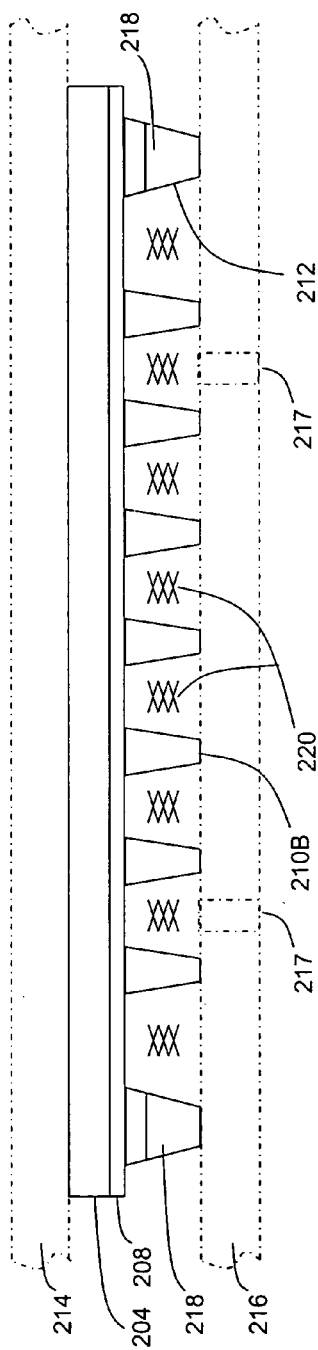
Figure 2F:
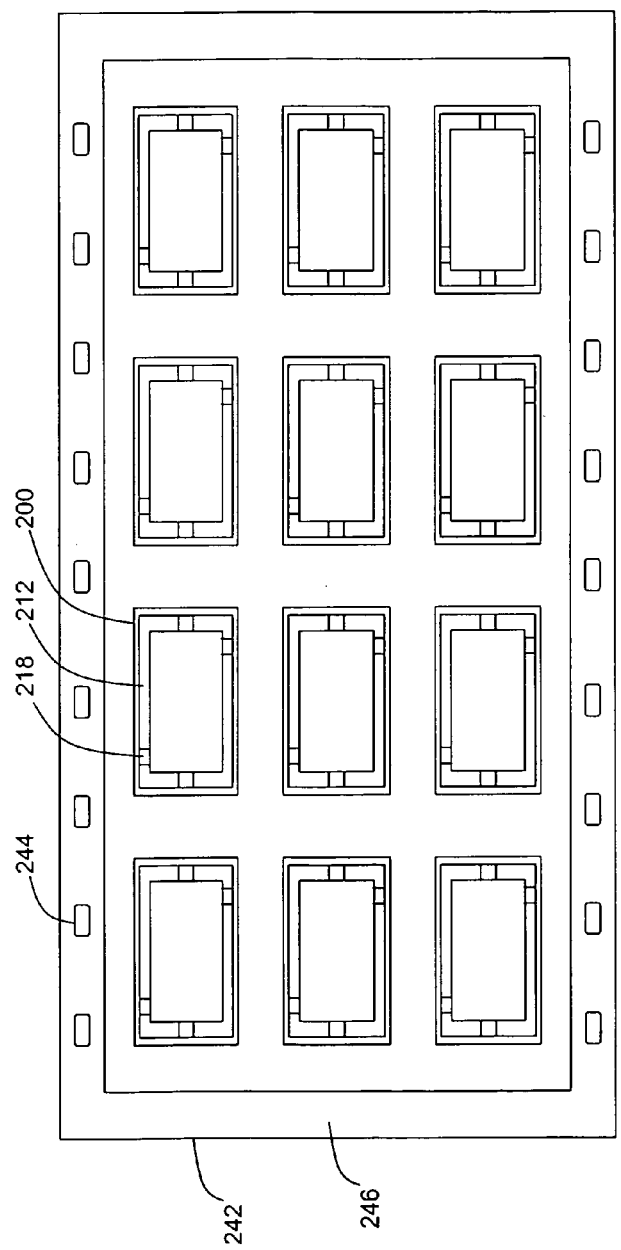
Figure 21:
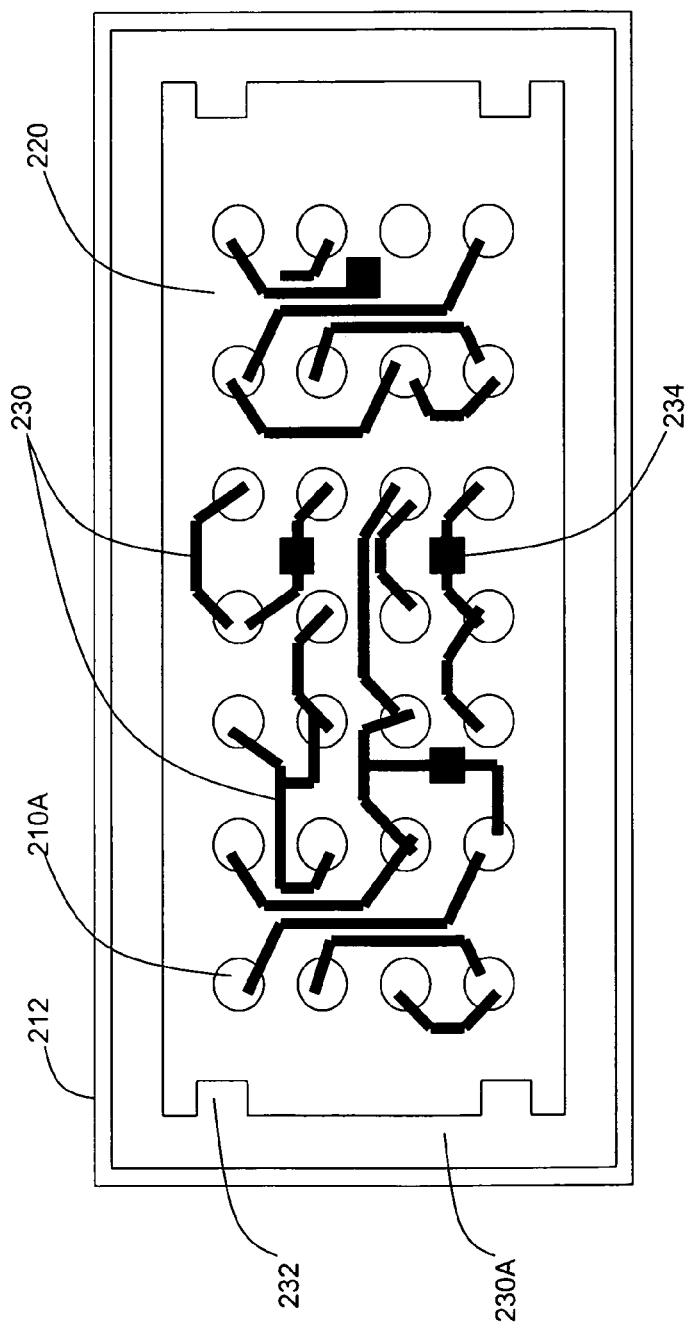

In the next stage of the method, at step 108, a molded dielectric layer 220 is formed on the plate 200 (FIGS. 2E-2G). In the molding process, a flowable composition is introduced between the pins 210 and cured to form the dielectric layer. The composition may be essentially any material which will cure to a solid form and form a dielectric.

For example, compositions which cure by chemical reaction to form a polymeric dielectric, such as epoxies and polyimides may be used. In other cases, the flowable composition may be a thermoplastic at an elevated temperature, which can be cured to a solid condition by cooling. Preferably, the layer 220, after molding, forms binding interfaces with features of the plate 200. The composition may further include one or more additives influencing properties of the layer 220. For example, such additives may include particulate materials such as silica or other inorganic dielectrics, or fibrous reinforcements such as short glass fibers.

During the molding processes, the plate 200 is sandwiched between a press plate 214 and a counter element 216 (shown using phantom lines) which in this embodiment is part of a molding tool (FIG. 2E). The counter element 216 is abutted against the tips 210B of the pins 210 and the flowable molding composition is injected or otherwise introduced into the space between the plate 200 and counter element 216.

In the particular embodiment depicted in FIG. 2E, the molding composition is injected through at least one opening, or gate, 217 in the counter element 216 (as shown) and/or press plate 214. Slots 218 are used as an escape passage for trapped air, and may also vent excess material of the molding composition. Upon completion of the molding process, the press plate 214 and the counter element 216 are removed (FIG. 2G). Ordinarily, the tips 210B of the pins are free of molding composition at the completion of the molding step. In some instances, a thin film of molding composition may overlie the tips of some or all of the pins. If this occurs, the thin film can be removed by exposing the bottom surface 226 (FIG. 2G) of the molded dielectric layer to a brief plasma etching or ashing process which attacks the molded dielectric.

In a variant of the molding step, the composition may be injected through the slots 218 in the spacer, and openings 217 in the counter element may serve as a vent. Alternatively, one or more openings (not shown) can be formed through layers 204 and 208 of the plate, and these openings may serve either as injection openings for the composition or as vents. In yet another variant, the composition may be provided as a mass disposed on the tips of the pins or on counter element 216 before the counter element is engaged with the tips of the pins, so that the composition is forced into the spaces between the pins as the pins are brought into abutment with the counter element. In another variant, when the plate 200 includes multiple spacers 212 defining individual sections of the plate, the openings 217 may selectively be associated with such sections.

In another embodiment, the plate 200 may be a portion of a larger frame 242 incorporating a plurality of the plates 200 (FIG. 2F). As depicted, the frame 242 illustratively includes sprocket holes 244 and a peripheral wall 246, which upper surface is coplanar with the tips 210B and 212B in the component plates 200. In this embodiment, the press plate and counter element of the molding tool are extended over the plate 242 and the spacer 246, respectively. Then, during the molding process, the molding composition is introduced simultaneously into the spaces between the component plates 200 and counter element 216 through individual gates 217 flowably coupled to a runner system of the molding tool. After the press plate and counter element are removed upon completion of the molding process, the component plates 200 may be separated (e.g., cut out) from the frame 242. Alternatively, such separation may occur after step 110 discussed below in reference to FIGS. 2H-2I.

The molding step forms the dielectric element, or dielectric layer, with a bottom surface 226 coplanar with the tips 210B of the pins and coplanar with the tip 212B of the spacer (FIG. 2G). The molding step also forms the dielectric element with a top surface 228 in engagement with the layer 208 and hence coplanar with the bases 210A of the pins and the base 212A of the spacer.

At step 110, conductive traces 230 are formed from the layers 204 and 206 using, e.g., an etch process (FIGS. 2H-2I). Together with the pins 210, the traces 230 form an electrical circuit of a substrate 240 fabricated using the method 100. Each trace 230 may be connected to at least one pin 210 and/or to at least one other trace. However, some traces may "float", i.e., be electrically disconnected from pins and other traces. Likewise, one or more of the pins may remain unconnected to traces, although typically most or all of the pins are connected to traces.

At least one trace 230 may be a peripheral trace 230A having a closed-loop pattern and surrounding at least some of pins or other traces as illustratively shown in FIG. 2I, where such traces are depicted using solid lines connected to bases of the respective pins or other traces. In the depicted embodiment, the peripheral trace 230A is disposed on the spacer 212. The peripheral trace may further comprise contact areas 232 having greater widths than other portions of the trace. In operation, the peripheral traces, as well as the spacers 212, may reduce electromagnetic interference (EMI) between electrical circuits present on the same or adjacent substrates.

The traces 230 may have different widths, including the widths which are smaller than the widths of the bases 210A and tips 210B of the pins 210 (as shown in FIGS. 2H-2I), thus facilitating fabrication of the substrate 240 having high routing density. Generally, the widths of the traces 230 are selected in a range from about 5 to 100 μm (e.g., 20-40 μm), however, portions of traces (e.g., contact areas 234) or some traces may have widths greater than 100 μm.

A substrate 340A according to a further embodiment has a recess 302 formed in a central region, recess 302 being open to the bottom surface 226 of the dielectric layer. Such a substrate can be formed by a process substantially as discussed above with reference to FIGS. 2A-2I, except that the pin-forming step is conducted so that no pins are formed in the central region, and the molding step is modified by using a counter element (not shown) having a projection extending upwardly in the central region.

In a substrate 340B of the embodiment of FIG. 3B, the recess 306 extends all the way to the top surface 228 and thus forms an opening extending through the dielectric layer. Such a recess may be formed by a projection on the counter element which engages the plate during the molding process. In the embodiment of FIG. 3B, the traces do not extend across the recess. However, some or all of the traces may extend across the recess.

Alternatively, the dielectric layer may be fabricated using a counter element without such a projection, so that the entire bottom surface as molded is flat, and then machined or etched to form the recess 302 or opening 306. In further variants, two or more recesses may be provided in the dielectric layer. Also, the recess need not be provided in a central region of the substrate.

Figure 4C:
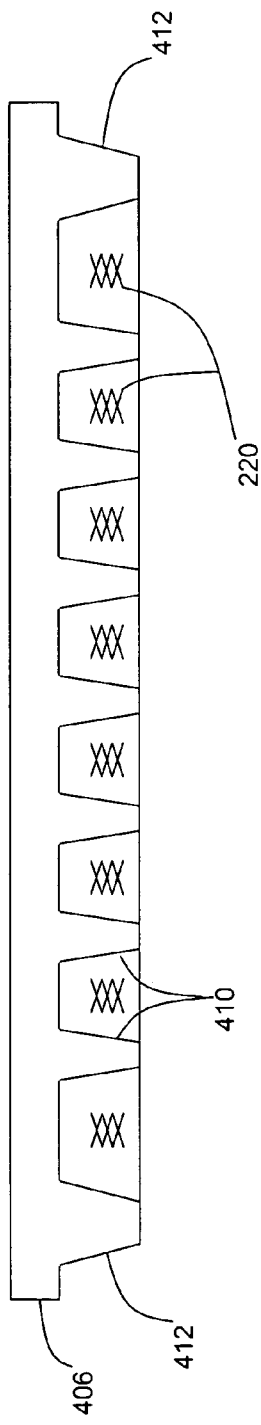
Figure 4D:
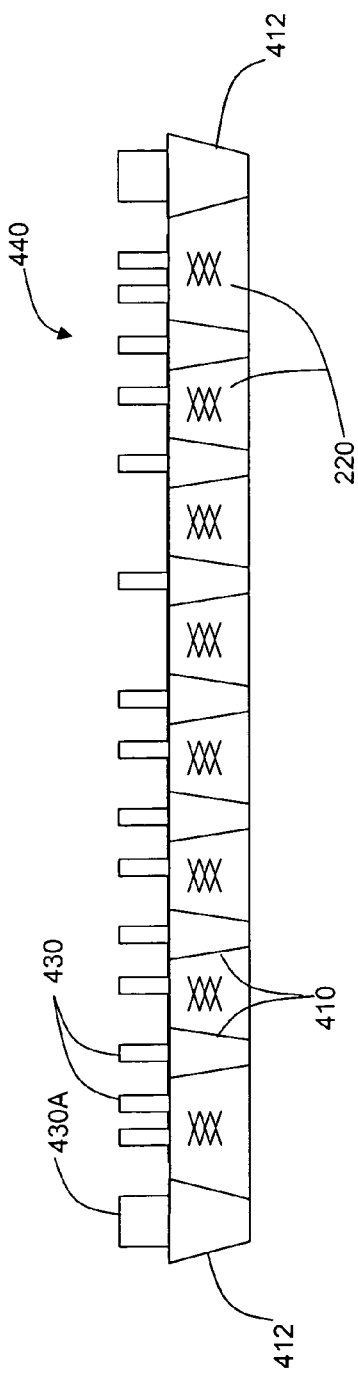

A substrate 440 according to a further embodiment of the invention is fabricated using a conductive plate 400 having a single layer 406 of the principal metal (e.g., Cu and the like) (FIG. 4A). Conductive pins 410 and an optional spacer 412 are formed on the plate 400 using an etch process or a plating process (FIG. 4B). The dielectric layer 220 (FIG. 4C) is fabricated using the process described above in reference to FIG. 2E. Then, conductive traces 430, including optional peripheral traces 430A, may be formed from the plate 400 using an etch process, thereby completing a process of fabricating the substrate 440 (FIG. 4D).

A substrate according to yet another embodiment of the invention is fabricated using two conductive plates 200 and 500 (FIG. 5A). In one embodiment, the plate 500 comprises a single layer 504 of the principal metal. In an alternate embodiment (not shown), a layer of conductive bonding material may be formed on an upper surface 506 of the layer 504. In one particular embodiment (FIG. 5B), the plate 500 is connected to the tips 210B of the pins 210 using a conventional metal-coupling process, such as thermosonic or ultrasonic bonding, eutectic bonding, solder bonding or the like. Then, during the molding process, the plate 500 serves as a counter element. In the molding operation, the polymer is injected between the plates 200 and 500. Alternatively, the dielectric layer is molded as described above in reference to FIG. 2E, and then the plate 500 is disposed on a bottom surface of the molded dielectric layer and, using metal-coupling process, is connected to the tips of the pins.

Figure 5C:
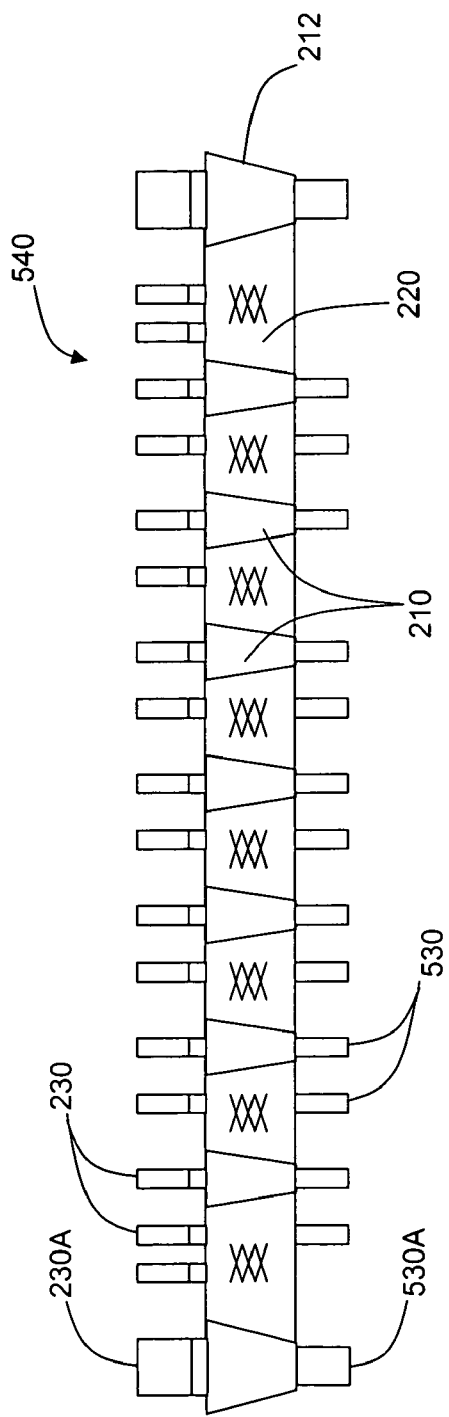

Then, conductive traces 530 are fabricated from the plate 500 (FIG. 5C). The traces 530 may be formed before, after, or contemporaneously with the traces 230 using the same technique (i.e., etch process). The traces 530 may include optional peripheral traces (one peripheral trace 530A is illustratively shown). Together, the pins 210 and traces 230, 530 form an electrical circuit of the substrate 540.

A process according to a further embodiment uses two conductive plates. Illustratively, such plates are multi-layered plates 200A and 200B (FIG. 6A), each of which includes principal metal layers 204 and 206 and etch stop layer 208 similar to the layers discussed above with reference to the plate 200 of FIG. 2B. In alternate embodiments, at least one of these plates may be formed from a single layer of the principal metal, such as Cu.

Figure 6B:
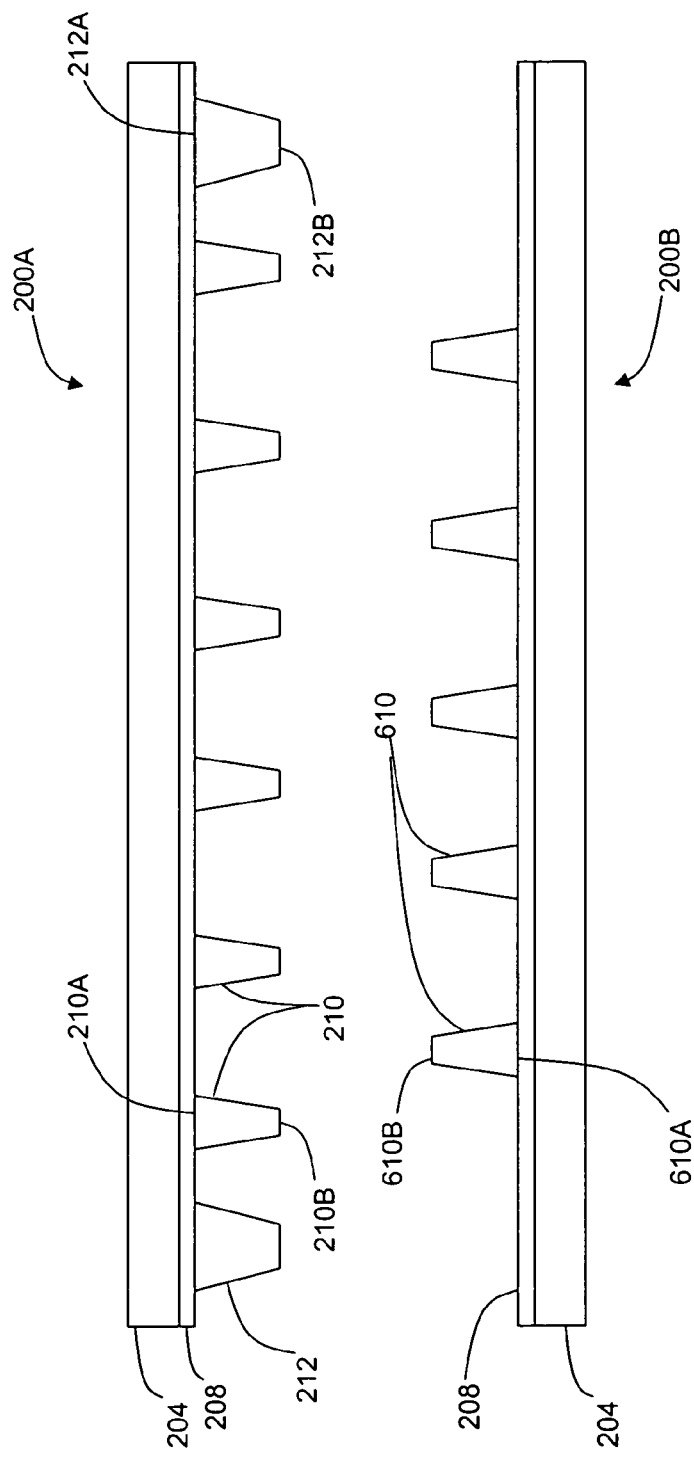

Pins 210 are fabricated in the plate 200A as discussed above in reference to FIG. 2C, and, similarly, pins 610 having bases 622 and tips 624 are fabricated in the plate 200B (FIG. 6B). The locations of the pins 610 are selected so that, when the plates 200A and 200B are assembled together, the pins 210 and 610 can be mutually interspersed with each other in at least one region of a substrate 640. For example, pins 210 can be provided as a first regular grid pattern having a particular pitch, whereas pins 610 can be provided as a second regular grid pattern having the same pitch.

Since the pins are tapered (i.e., tips of the pins are smaller than their bases), in such a substrate the interspersed pins may be disposed closer to one another than the pins formed on the same plate, thus increasing density of the conductive pins in the substrate being fabricated. The tips 210B of the pins on the first plate 200A are abutted against the second plate 200B, whereas the tips 610B of the pins on the second plate are abutted against the first plate 200A. Then, using a conventional metal-coupling process, the tips 210B of the pins 210 are connected to the plate 200B and the tips 610B of the pins 610 are connected to the plate 200A, respectively.

Figure 6C:
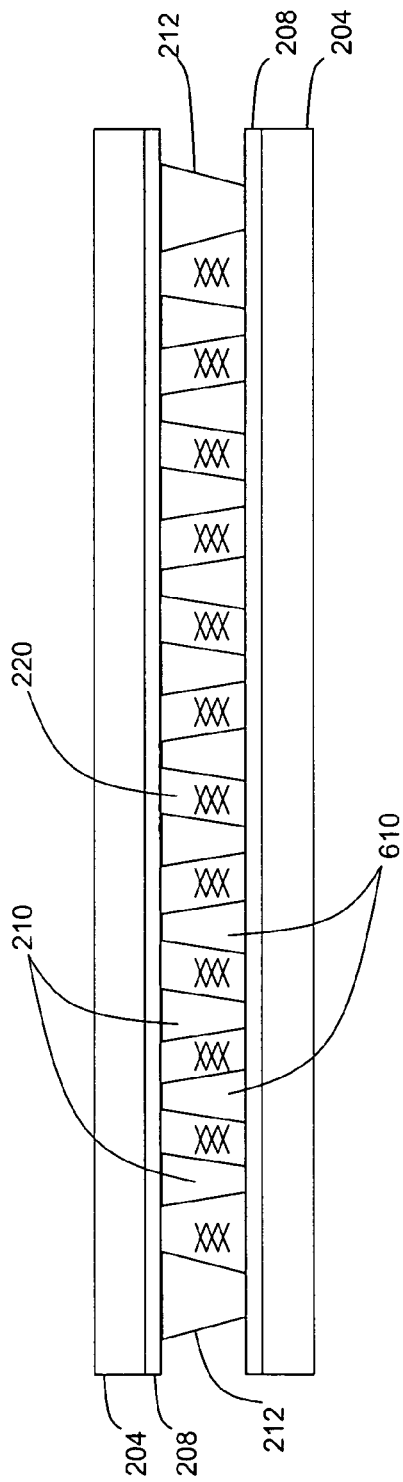
Figure 6D:
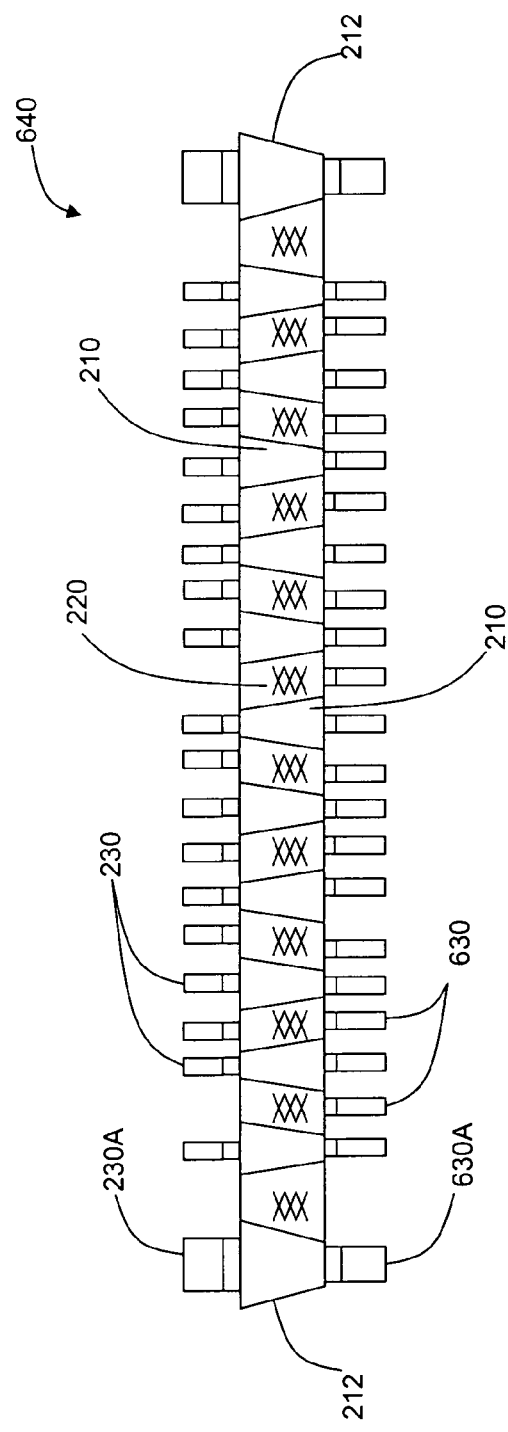

The dielectric layer 220 is molded in the space between the plates (FIG. 6C) using a process discussed above in reference to FIG. 2E where one of the plates may be used as a counter element. Using an etch process, the layers 204 and 208 of the plates 200A, 200B are patterned to form the traces 230 and 630 (including optional peripheral traces 230A and 630A) of the substrate 640.

A process according to another embodiment uses the press plate and counter element forming, around a perimeter of the substrate being fabricated, an enclosure for the molding composition. The substrates may be fabricated with a peripheral spacer (substrate 740A in FIG. 7A and substrates in FIGS. 9C-9D), as well as without the spacer (substrate 740B in FIG. 7B).

Figure 8A:
FIGS. 8A-8D are schematic, cross-sectional views of portions a substrate fabricated during successive stages of a method according to yet further embodiment of the invention.
Figure 8B:
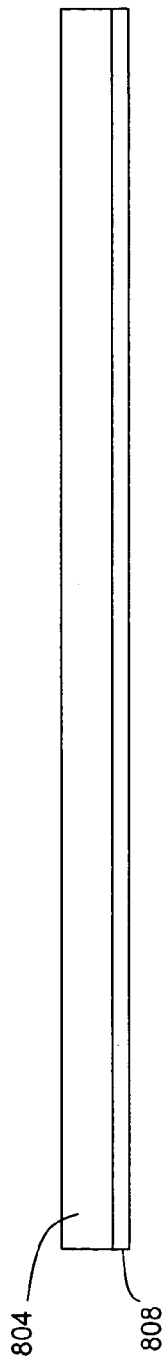
Figure 8C:
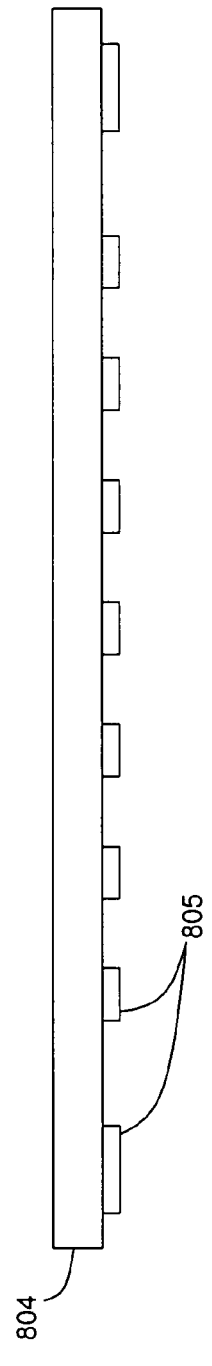
Figure 8D:
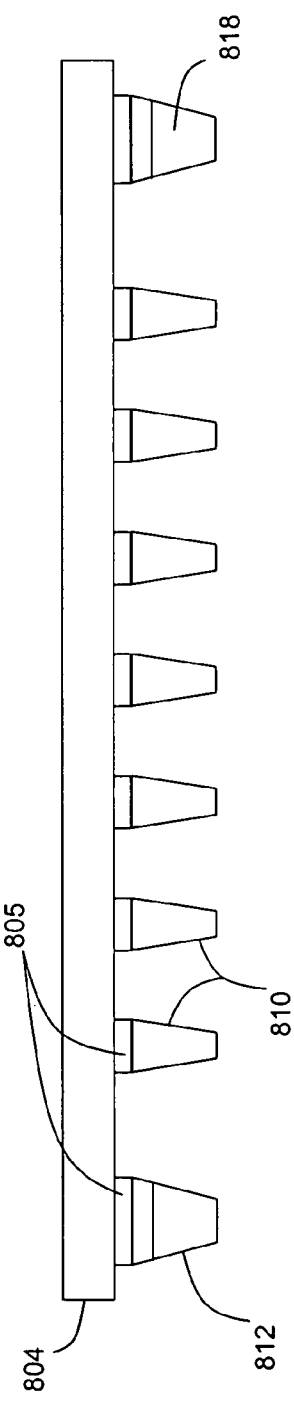

A process according to yet further embodiment uses a single plate 804 (FIG. 8A). The plate 804 is formed from the principal metal (e.g., copper plate) to a thickness from about 10 to 300 μm. Then, a barrier layer 808 (e.g., Ni barrier layer) is deposited on a bottom surface of the plate 804 (FIG. 8B). The barrier layer 808 is patterned to form, at pre-determined locations, pads 805 for conductive pins and optional spacers (FIG. 8C). Conductive pins 810 and spacers 812 may be formed on the pads 805 using, for example, a plating process (FIG. 8D). In the depicted embodiment, a resulting structure includes a peripheral spacer having slots 818. Such a structure may further undergo molding and etching processes discussed above in reference to FIGS. 2D-2I. Structures with plates and pins can be formed in other ways as well. For example, such a structure can be formed by coining a single metal layer or a multi-layer metallic laminate.

Substrates fabricated according to yet further embodiments the method of FIG. 1 may comprise combinations of features discussed above in reference to the substrates 240, 340A-340B, 440, 540, 640, and 740A-740B. For example, the substrates 440, 540, 640, and 740A-740B may include recesses and/or openings, like those included in substrates 340A-340B.

FIGS. 9A-9D depict a series of schematic, cross-sectional views of exemplary structures using the substrates fabricated in accordance with the method of FIG. 1.

Microelectronic elements, or devices, may be mounted on the substrates using techniques such as a ball-bonding and/or wire-bonding technique. In FIGS. 9A-9D, the devices adapted for mounting using the ball-bonding and wire-bonding techniques are collectively denoted using reference numerals 906 and 908, respectively. Similarly, such techniques may be used for connecting the substrates stacked on one another or juxtaposed substrates.

Figure 9C:
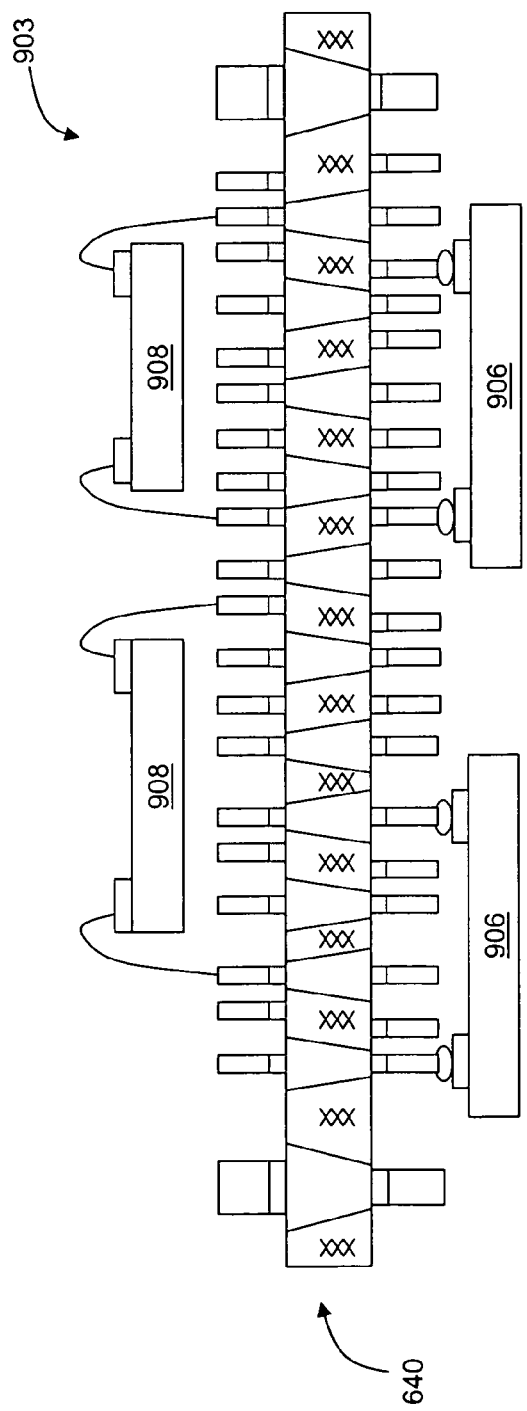

More specifically, the FIGS. 9A, 9B, and 9C depict exemplary microelectronic structures or units 901, 902, and 903 each comprising one substrate 240, 540, and 640, respectively. In the embodiment depicted in FIG. 9A, the substrate 240 is disposed on and connected to a circuit panel 912 and includes an electrically conductive EMI shield 910. The tip ends of the pins of substrate 212 are solder bonded to contact pads of circuit panel 912. The microelectronic devices 906, 908 and the EMI shield 910 are mounted on an upper surface 241 of the substrate 240. The EMI shield 910 is ball-bonded to the peripheral trace 230A of the substrate and, as such, electrically connected to the spacer 212. Herein, the spacer 212 is further connected to ground contact pads 914 of the circuit panel 912. For example, the unit including substrate 240, devices 906 and 908 and shield 910 may be mounted to panel 912 using solder-bonding techniques commonly used for surface-mounting microelectronic elements on circuit boards. In embodiments shown in FIG. 9B and 9C, the devices 906 and 908 are mounted on both sides of the substrates 540 and 640, respectively.

Figure 9D:
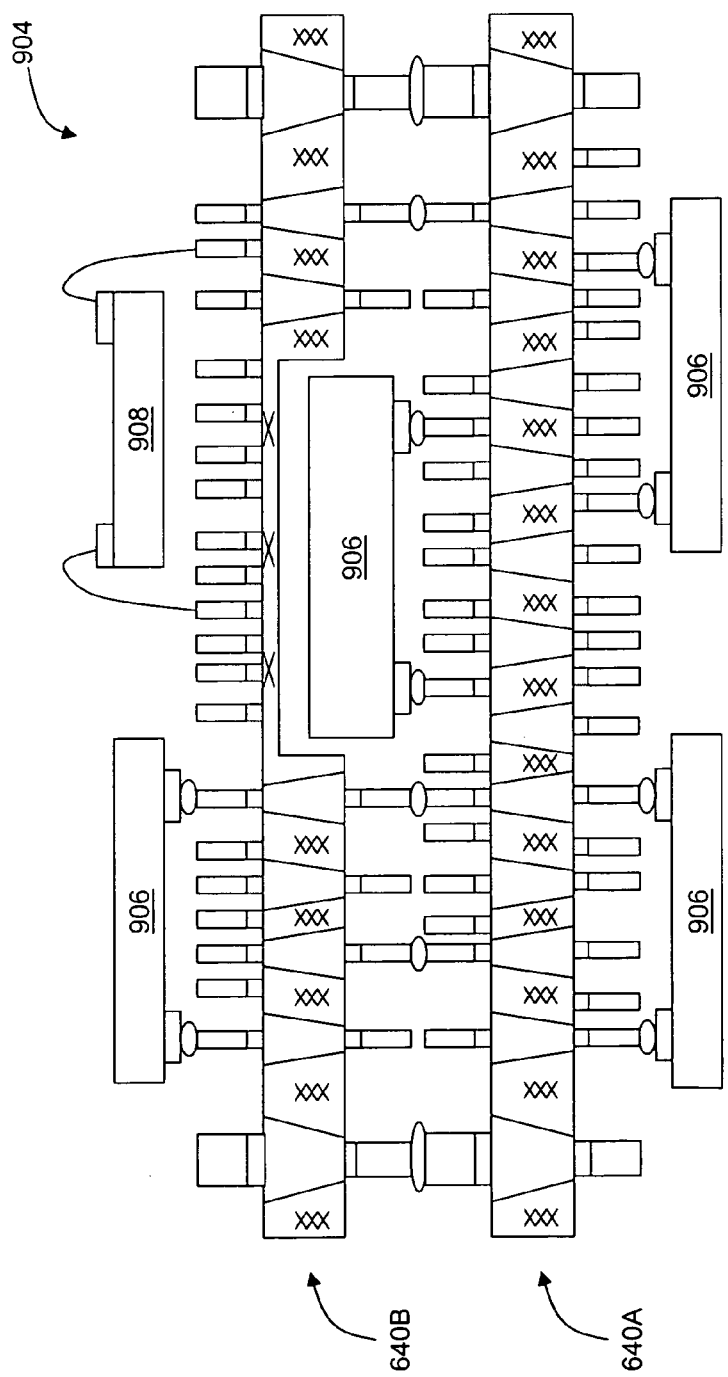

The substrates discussed above may be interconnected to form multi-substrate structures. FIG. 9D depicts an exemplary assembly, or package, 904 comprising two stacked units 640A and 640B, each of which includes a substrate as discussed above. One of the stacked units (denoted using a reference numeral 640B) has a recess formed in the molded dielectric layer of the substrate. Thus substrate of the other unit 640A constitutes a panel having a top surface, contact pads exposed at the top surface of said panel, and an additional circuit element 906 mounted to said panel and extending upwardly therefrom. The dielectric layer of unit 640B overlies the top surface of the panel in unit 640A. The additional circuit element 906 is received in the recess. The tip ends of the pins in unit 640A are bonded to the contact pads of said panel. Illustratively, the peripheral lines and a portion of the traces of the stacked substrates of the units 640A and 640B are also connected using such a technique to form the assembly 904. In a variant, the assembly 904 may comprise more than two substrates, or the substrates of different types.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A microelectronic substrate having a plurality of traces for electrical interconnection with external contacts of a semiconductor chip mountable thereto, comprising:
   a plurality of first contact pins, each first pin having a base and a tip;
   a plurality of first conductive traces adapted for electrical connection with the external semiconductor chip, at least some of the first traces being coupled to the bases of the first pins so that the first pins project downwardly from the first traces; and
   a molded dielectric layer disposed in regions around the first pins and having an exposed bottom surface coplanar with the tips of the first pins, a top surface remote from the bottom surface, wherein the first traces extend along the top surface of the molded dielectric layer, and at least some of the tips of the first pins are exposed at the bottom surface of the dielectric layer.

2. The substrate of claim 1 wherein the top surface of said dielectric layer is coplanar with the bases of the first pins, said traces extending over the top surface of said dielectric layer.

3. The substrate of claim 1 wherein the first traces include an electrically conductive principal metal and a conductive barrier layer disposed between the principal metal and the bases of the first pins.

4. The substrate of claim 3 wherein the barrier layer is formed from Ni.

5. The substrate of claim 1 wherein the first pins form at least one grid-like pattern having a pitch in range from 100 to 10000 µm.

6. The substrate of claim 1 wherein widths of the first traces are equal to or smaller than widths of the bases of the first pins coupled to the first traces.

7. The substrate of claim 1 wherein:
   the first traces and the first pins predominantly include Cu; and
   the dielectric layer predominantly includes epoxy.

8. The substrate of claim 1 wherein different ones of said first pins have different form factors.

9. The substrate of claim 1 wherein said dielectric layer has a recess open to the bottom surface of the dielectric layer, said first pins being horizontally offset from said recess.

10. The substrate of claim 9 wherein said dielectric layer includes a central region having said recess formed therein and a peripheral region extending on opposite sides of said central region, said first pins extending through said peripheral region.

11. The substrate of claim 10 wherein at least some of said first traces extend over said central region.

12. A unit including a substrate as claimed in claim 10 and a microelectronic element disposed above said first traces, said microelectronic element being electrically connected to at least some of said first pins by at least some of said first traces.

13. An assembly including a unit as claimed in claim 12 and an a additional subassembly including a panel having a top surface, contact pads exposed at the top surface of said panel, and an additional circuit element mounted to said panel and extending upwardly therefrom, said dielectric layer of said unit overlying the top surface of the panel so that said additional circuit element is received in said recess, the tip ends of the first pins being bonded to the contact pads of said panel.

14. The substrate of claim 1 further comprising a peripheral trace having a closed-loop form factor, said peripheral trace surrounding at least some of said first traces.

15. The substrate of claim 14 wherein the peripheral trace comprises contact areas having widths greater than a width of said peripheral trace.

16. The substrate of claim 1 further comprising a spacer having a closed-loop form factor surrounding at least some of the first pins.

17. The substrate of claim 15 wherein said spacer has a bottom edge coplanar with the tips of the first pins.

18. The substrate of claim 16 wherein the spacer has at least one opening.

19. The substrate of claim 1 further comprising a plurality of second traces extending over said bottom surface of said dielectric layer, at least some of said second traces being coupled to at least some of the tip ends of said first pins.

20. The substrate of claim 1 further comprising a plurality of second pins having bases at said bottom surface of the dielectric layer, said second pins extending upwardly through said dielectric layer and having tips remote from said bottom surface, at least some of said first traces being coupled to the tips of at least some of said second pins.

21. The substrate of claim 20 wherein the bases of said first pins are wider than the tips of said first pins and wherein the bases of said second pins are wider than the tips of said second pins, and wherein at least some of said first and second pins are interspersed so that the tips of at least some second pins lie between the bases of at least some first pins, and so that the tips of at least some first pins lie between the bases of at least some second pins.

22. The substrate of claim 20 further comprising a plurality of second traces extending over said bottom surface of said dielectric layer, at least some of said second traces being coupled to at least some of said first pins.

23. A unit comprising the substrate of claim 1 and at least one microelectronic element, said microelectronic element being electrically connected to at least some of said first pins by at least some of said first traces.

24. An assembly including a plurality of units as claimed in claim 23 stacked in superposed arrangement with the tip ends of the first pins in a higher unit in the stack electrically connected to the first pins of a lower unit in the stack.

25. The microelectronic substrate of claim 1, wherein the molded dielectric layer is formed by introducing a flowable composition between the first pins and curing the same.

26. The microelectronic substrate of claim 1, wherein the first pins are formed by etching a metal plate.

27. The microelectronic substrate of claim 1, wherein the first traces are formed by etching a metal plate.

28. The microelectronic substrate of claim 1, wherein the dielectric layer predominantly includes a polymeric dielectric.

29. A microelectronic substrate having a plurality of traces for electrical interconnection with external contacts of a semiconductor chip mountable thereto, comprising:
   a plurality of etched metal first contact pins, each first pin having a base and a tip;
   a plurality of first conductive traces adapted for electrical connection with the external semiconductor chip, at least some of the first traces being coupled to the bases of the first pins so that the first pins project downwardly from the first traces; and
   a molded dielectric layer disposed in regions around the first pins and having an exposed bottom surface coplanar with the tips of the first pins, a top surface remote from the bottom surface, wherein the first traces extend along the top surface of the molded dielectric layer, and at least some of the tips of the first pins are exposed at the bottom surface of the dielectric layer.

30. The substrate of claim 29 wherein the top surface of said dielectric layer is coplanar with the bases of the first pins, said first traces extending over the top surface of said dielectric layer.

31. The substrate of claim 29 wherein the first traces include an electrically conductive principal metal and a conductive barrier layer disposed between the principal metal and the bases of the first pins.

32. The substrate of claim 29 wherein the barrier layer is formed from Ni.

33. The substrate of claim 29 wherein the first pins form at least one grid-like pattern having a pitch in range from 100 to 10000 μm.

34. The substrate of claim 29 wherein widths of the first traces are equal to or smaller than widths of the bases of the first pins coupled to the first traces.

35. The substrate of claim 29 wherein:
   the first traces and the first pins predominantly include Cu; and
   the dielectric layer predominantly includes epoxy.

* * * * *

UNITED STATES PATENT AND TRADEMARK OFFICE
CERTIFICATE OF CORRECTION

| | | |
|---|---|---|
| PATENT NO. | : 7,759,782 B2 | Page 1 of 1 |
| APPLICATION NO. | : 11/400665 | |
| DATED | : July 20, 2010 | |
| INVENTOR(S) | : Belgacem Haba, Craig S. Mitchell and Apolinar Alvarez, Jr. | |

It is certified that error appears in the above-identified patent and that said Letters Patent is hereby corrected as shown below:

Column 2, line 16, before "a substrate" insert --of--.
Column 2, line 19, before "a substrate" insert --of--.
Column 2, line 58, before "range" insert --the--.
Column 3, line 31, before "may be" insert --,--.
Column 4, line 45, before "pins" insert --the--.
Column 5, line 45, after "using" insert --a--.
Column 6, line 30, after "to" insert --a--.
Column 7, line 3, "solder bonded" should read --solder-bonded--.
Column 7, line 14, "FIG." should read --FIGS.--.
Column 7, line 24, after "Thus" insert --the--.
Column 7, line 67, before "traces" insert --first--.
Column 8, line 8, after "in" insert --the--.
Column 8, line 35, after "an" delete "a".
Column 10, line 24, after "in" insert --the--.

Signed and Sealed this
Ninth Day of August, 2011

David J. Kappos
*Director of the United States Patent and Trademark Office*